United States Patent [19]
Gersho et al.

[11] 3,931,596
[45] Jan. 6, 1976

[54] ADAPTIVE QUANTIZER APPARATUS USING TRAINING MODE

[75] Inventors: Allen Gersho, Berkeley Heights; David Joel Goodman, Summit, both of N.J.

[73] Assignee: Bell Telephone Laboratories, Incorporated, Murray Hill, N.J.

[22] Filed: Sept. 30, 1974

[21] Appl. No.: 510,412

[52] U.S. Cl. ............ 332/11 D; 178/66 R; 325/38 B
[51] Int. Cl.[2] ............ H03K 13/22
[58] Field of Search ....... 332/11 R, 11 D; 325/38 R, 325/38 B; 178/66 R

[56] References Cited

UNITED STATES PATENTS

| | | | |
|---|---|---|---|
| 3,699,566 | 10/1972 | Schindler | 332/11 D X |
| 3,806,806 | 4/1974 | Brolin | 332/11 D X |
| 3,815,033 | 6/1974 | Tewksbury | 332/11 D X |
| 3,857,111 | 12/1974 | Deschenes et al. | 332/11 D |

OTHER PUBLICATIONS

Johnson et al., "Adaptive Rate Delta Modulator"–IBM Tech. Disclosure Bulletin, Vol. 15, No. 11, pp. 3338–3341, Apr., 1973.

Jones et al., "Adaptive Delta Modulator with Variable–Sample Rate", *IBM Tech. Disclosure Bulletin*, Vol. 15, No. 10, pp. 3168–3169, Mar., 1973.

Henry, "Logarithmic Digital Compandor for Delta Modulator"–IBM Tech. Disclosure Bulletin–Vol. 17, No. 3, pp. 909–910, Aug., 1974.

*Primary Examiner*—Alfred L. Brody
*Attorney, Agent, or Firm*—G. E. Murphy; W. Ryan

[57] ABSTRACT

Ideally, when a signal is quantized, the range of the quantizer should be matched to the power of the signal. Disclosed herein is adaptive quantizer apparatus which utilizes a particular quantizing scheme for those communications where the power of the signal to be quantized is unknown, but remains constant for the duration of a communication. The amplitude range of an adaptive quantizer is adjusted during an initial training period to a value appropriate to the power of the applied input signal. This is accomplished by successively altering the amplitude range by a multiplicative quantity that depends upon the amplitude of the quantizer output signal and upon the time elapsed since the onset of the training period.

10 Claims, 4 Drawing Figures

(PRIOR ART)

CONTROL
ADAPTION LOGIC CONTROL
16
13
12
10
$E_{IN}$
11
ADAPTIVE QUANTIZER
ENCODER
OUTPUT SIGNAL
15
14
DELAY 13
17
ROM
29
MULTIPLIER
$a_k m_i$
21
ACCUMULATOR
$y_{k+1}$
22
EXPONENTIAL TRANSFORMATION
CONTROL
$x_{k+1}$
$m_i$
$a_k$
31
ROM
16
28
CLOCK

ADAPTIVE QUANTIZER APPARATUS USING TRAINING MODE

FIELD OF THE INVENTION

This invention pertains to signal processing systems and, more particularly, to adaptive quantization apparatus.

BACKGROUND OF THE INVENTION

Numerous schemes have been proposed for apparatus using adaptive quantization techniques. See, for example, the article entitled "Adaptive Quantization in Differential PCM Coding of Speech" authored by P. Cummiskey, N. S. Jayant and J. L. Flanagan, *Bell System Technical Journal*, Vol. 52, September 1973, pp. 1105–1118, hereinafter referred to as the *B.S.T.J.* article. Such schemes have in common the objective of continually tracking changes in signal power level. As a consequence, even if the signal power level happens to remain constant, the quantizer decision levels fluctuate randomly according to short-term estimates of the current power level and thus the quantizer characteristic is constantly being altered. Ideally, a quantizer for a given constant signal power level should have a constant characteristic matched to that power level.

SUMMARY OF THE INVENTION

In accordance with our invention, an adaptive quantizer is adjusted, during a training period, to the appropriate amplitude range when a new constant signal power communication is established. Upon completion of the training period, the quantizer characteristic is fixed for the duration of the communication. Accordingly, the quantization error is substantially reduced because the quantizer amplitude range is adjusted, during the initial training period, to a value near optimum for the signal even though the signal power is unknown a priori. More particularly, at each sample time, during the training period, the amplitude range is adjusted by a multiplicative quantity that depends upon the quantized output signal and upon the time elapsed since the onset of training. Assuming independent identically distributed inputs, it may be shown that the quantizer range converges to a fixed multiple of the rms value of the input signal.

DETAILED DESCRIPTION

Figure 1:
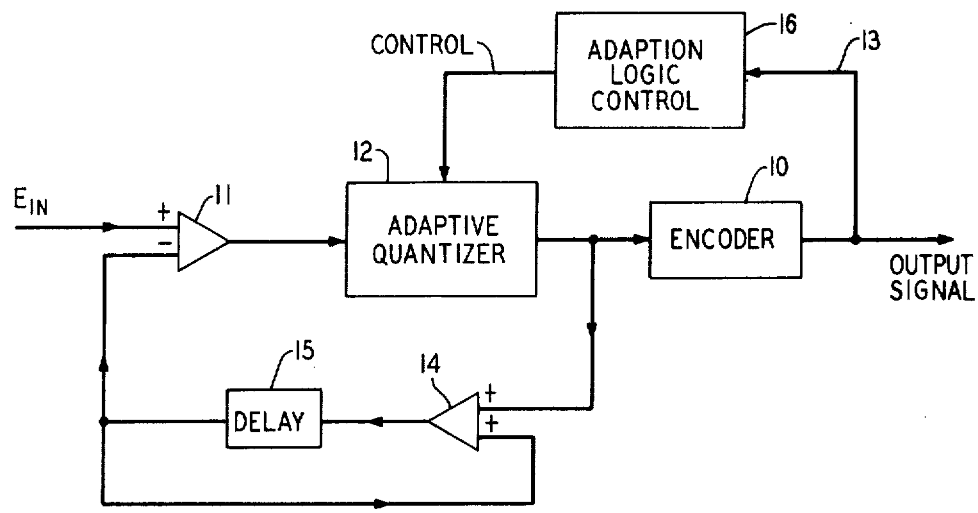
FIG. 1 is a block diagram of an adaptive differential pulse code modulation circuit of the prior art.

FIG. 1 depicts a prior art adaptive differential pulse code modulation (ADPCM) system, which is described in detail in the above-cited *B.S.T.J.* article by P. Cummiskey, N. S. Jayant and J. L. Flanagan, and which illustrates one application, among others, of an adaptive quantizer. In the ADPCM system of FIG. 1, differential input amplifier 11 develops an output signal proportional to the difference between an applied signal $E_{IN}$ and a signal which is an estimate of the applied signal. This difference signal is quantized in adaptive quantizer 12. The output of quantizer 12, after encoding by encoder 10, constitutes the digital output signal transmitted to a distant receiver. The output signal of quantizer 12 is also applied to summing amplifier 14. Summing amplifier 14, in conjunction with first order prediction network 15, is utilized to develop an estimate of the incoming signal. If the estimate of the input signal is fairly accurate, then the difference signal emanating from amplifier 11 will be small, and thus more accurately represented by a fixed number of bits than the input signal itself. The difference signal, although not nearly as redundant as the original signal, still exhibits a wide amplitude range. In order to make efficient use of the available quantization levels of quantizer 12, the quantizer range should be matched to the signal. Accordingly, the need for adaptive quantization is apparent; adaption logic network 16 utilizes the output signals of the system to determine appropriate quantization steps. That is, network 16 monitors the output of encoder 10 or, alternatively, quantizer 12, and provides for adaption of the quantizer step size on the basis of the most recently quantized output. For example, if the quantized output corresponds to one of the higher quantizer levels, the quantizer is likely to be overloaded and the step size is increased. On the other hand, if the quantized output corresponds to one of the lower levels, the step size is decreased. Step size adaption effectively compensates for signal variations with the result that the quantizer attempts to treat low level signals the same as high level signals. The objective is that each of the quantizer levels be used a significant portion of the time regardless of the average power level of the incoming signal.

Figure 2:
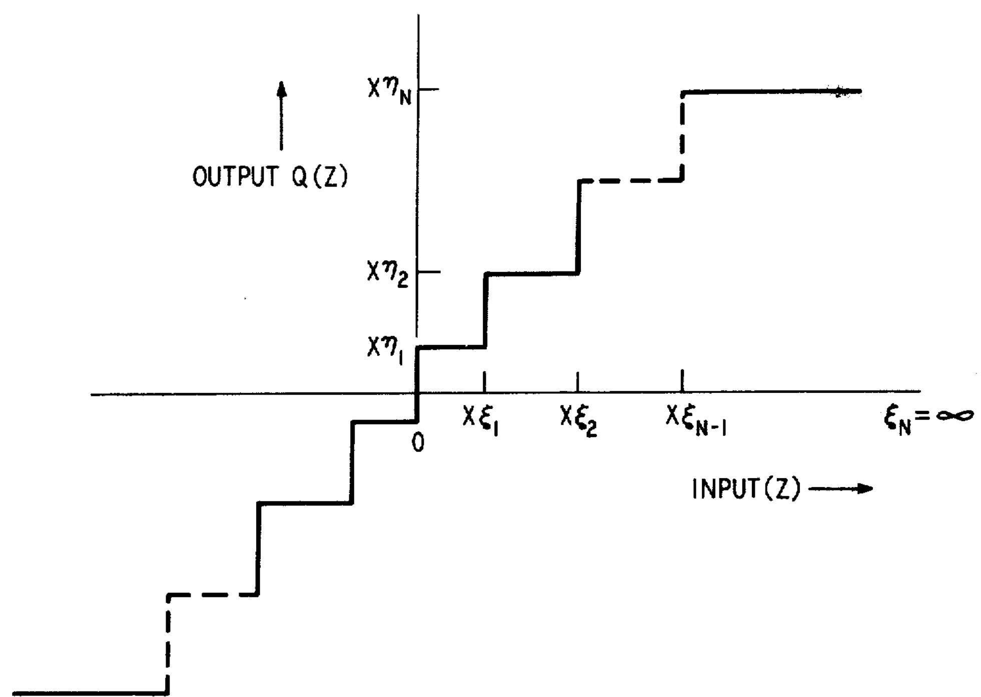
FIG. 2 depicts the characteristic of an adaptive quantizer.

The characteristic of an adaptive quantizer with 2N output levels is shown in FIG. 2. It is characterized by a set of N decision levels $\{x\xi_i\}$, $0 \leq i \leq N-1$, and a set of N quantization levels, $\{x\eta_i\}$, $1 \leq i \leq N$. For a nonnegative input, $z$, the output of the quantizer is $$Q(z) = x\eta_i \text{ for } 0 \leq x\xi_{i-1} \leq z < x\xi_i$$

$i = 1, 2, \ldots, N$ where $\xi_0 = 0$, $\xi_{N-1} = 1$, and $\xi_N = \infty$. Because of symmetry, the response to a negative input is $$Q(z) = -Q(-z) \text{ for } z < 0$$

It is assumed that the parameters $\xi_i$ and $\eta_i$ have been selected for the desired quantizer shape while the range scale factor $x$ ($x > 0$), determines the dynamic range.

In a fixed quantizer, the amplitude range scale factor $x$, is a constant chosen to provide a compromise between the goal of accommodating a wide range of signal levels ($x$ large) and the goal of achieving high resolution ($x\xi_i - x\xi_{i-1}$ small). In previously known adaptive quantizers, $x$ is adjusted in response to the immediate quantized output level. For example, in the apparatus 0 in the above-mentioned *B.S.T.J.* article, at each sample time the amplitude range is adjusted by a multiplicative quantity that depends upon the magnitude of the most recently quantized output signal. Adaptive quantizers have the common objective of tracking changes in signal power level on a continual basis. As a consequence, even if the power level happens to be constant, the quantizer decision levels fluctuate randomly according to short-term estimates of the power level.

In a number of applications, however, where the signal power is unknown but constant, it is desirable to adjust the quantizer to the appropriate signal level when a new communication is established and then hold the quantizer characteristic fixed for the duration of the communication. In accordance with this invention, at each sample time during a training period, the amplitude range is adjusted by a multiplicative quantity that depends upon the quantizer output, e.g., the most recently quantized output signal, and upon the time elapsed since the onset of training.

Thus, a specific adaption rule is utilized which allows the quantizer, during the training period, to approach an optimum characteristic for a given applied signal. More particularly, with each sample $z_k$ ($k = 0,1,2, \ldots$), of the input sequence, the range scale $x$ of the quantizer characteristic is changed by a multiplicative factor controlled by the magnitude of the output level associated with $z_k$. Specifically, the sequence of range values $x_k$ ($k = 1,2, \ldots$) evolves from a predetermined initial value $x_O$ and the rule, $$M_i^{a} x_k \qquad i = 1,2, \ldots, N \tag{1}$$

The multipliers satisfy the inequalities $$1 > M_1 \leq M_2 \leq \ldots \leq M_N > 1 \tag{2}$$

and the exponents $\{a_k\}$ comprise a non-negative sequence that is independent of the input process. It is noted that this sequence is time dependent, possibly changing value for each sample time, as discussed hereinafter.

Thus, the multiplicative quantity, $M_i^{a_k}$, depends upon the amplitude of the quantized signal and upon the time elapsed since the onset of the training mode. The multiplier ordering follows from the goal of increasing the range on evidence that the present range is too small. Such evidence is provided by the occurrence of an input in an outer quantization interval. [$Q(z_k) = \pm x_k \eta_i$ with $i$ near N.] Conversely, the adaptation scheme decreases the range on evidence that the range is too large [$Q(z_k) = \pm x_k \eta_i$ with $i$ near 1].

In the apparatus of the above-mentioned *B.S.T.J.* reference, adaptation proceeds in a "tracking" mode, i.e., equivalently, $a_k = 1$ for all $k$. Thus, adaption in that system is not a function of time. When the input to the tracking adaptive quantizer is an independent stationary process, the range, $x_k$, approaches a stationary (or cyclostationary) random process. In the "training" mode adaptive quantizer of this invention, the sequence of exponents $\{a_k\}$ selectively converges to zero with time, and in the limit $x_k$ tends toward a constant because $M_i^{a_k} \rightarrow 1$ for all $i$ as $k \rightarrow \infty$.

The advantages of the training mode quantizer of this invention evolve from the fact that when $\sigma$ is the rms value of the input, $x_k$ approaches $\sigma_{\overline{y}}$ with the probability one, and that the range-to-rms value ratio, $\overline{y}$, depends only on the normalized input distribution and the multipliers $M_i$. Thus, a designer may determine multipliers that cause the quantizer range to converge to a value appropriate to the actual input power, even though that power is unknown in advance.

Let the quantizer input $\{z_k\}$ be an independent identically distributed random process with variance $\sigma^2$ and normalized magnitude distribution:

$$\phi(t) = Pr\{|z_k|/\sigma \leq t\} \tag{3}$$

It is assumed that the designer knows $\phi(t)$, but the value of the variance, $\sigma^2$, is unknown. For any range $x = \sigma y$, ($y > 0$), denote by $p_i(y)$ the probability that the input magnitude falls in the $i^{th}$ quantization interval:

$$p_i(y) = Pr\{\sigma y \xi_{i-1} \leq |z| < \sigma y \xi_i\} = \phi(y\xi_i) - \phi(y\xi_{i-1}) \tag{4}$$

which is independent of $\sigma$. Define $\beta(y)$, the adaption bias function, by $$\beta(y) = \sum_{i=1}^{N} p_i(y) \log M_i. \tag{5}$$

Let $\overline{y}$ be the desired range-to-signal ratio so that if $\sigma$ were known to the designer he would fix the range at $\sigma\overline{y}$. It may be shown that if the multipliers $M_i$ are chosen to satisfy Eq. (2) and the constrain $\beta(\overline{y}) = 0$, and if the exponents $a_k$ are selected, in accordance with this invention, to converge to zero so slowly with time that $$\sum_{1}^{\infty} a_k$$

is infinite but rapidly enough that $\Sigma a_k^2$ is finite, then $x_k$ converges to $\sigma\overline{y}$ with probability one.

The significance of this is that a designer may attain a desired range-to-signal ratio, $\overline{y}$, simply by calculating $p_1(\overline{y})$ and selecting multipliers satisfying $\Sigma p_i(\overline{y}) \log M_i = 0$.

Conversely, because $\beta(y) = 0$ has a unique root, $\overline{y}$, one may predict the final quantizer range that will result from any choice of multipliers satisfying Eq. (2).

Although the range, $x_k$, converges to $\sigma\overline{y}$ as $k \rightarrow \infty$, a practical adaptive quantizer operates in the training mode for only a limited time period, e.g., K samples, after which adaptation terminates and the range remains fixed at $x_K$. Although a low value of K (fast adaption) is desirable, it is clear that (a) the distance of $x_K$ from $\sigma\overline{y}$ designated $\epsilon_K$, and (b) the size, $S_K$, of the set of signal powers to which the quantizer can adapt, both depend on K. As K becomes large, $\epsilon_K$ goes to zero and $S_K$ goes to infinity. However, for K fixed, there is a trade-off between these two quality measures. Letting $$\log M_i = \gamma L_i, \tag{6}$$

the design parameter $\gamma$ is introduced which reflects this trade-off. By adjusting $\gamma$, a designer can obtain a desired compromise between $\epsilon_K$ and $S_K$.

First it is observed that the asymptotic or ultimate range, $\sigma\overline{y}$, is independent of $\gamma$ because Eq. (5) may be written $$\beta(y) = \gamma \sum_{i=1}^{N} p_i(y) L_i$$

and $\overline{y}$ is the unique solution of $\beta(y) = 0$. Therefore, one can assume that $L_i$ is selected to provide the correct $\overline{y}$ and can consider the effect of $\gamma$ on $S_K$ and $\epsilon_K$. One measure of the size of the set of signal powers to which the quantizer can adapt is the ratio of the maximum range attainable, after K operations of the quantizer, to the minimum attainable range. The maximum range at time K arises when the magnitudes of the first K input samples are all quite high, falling in the outermost quantization intervals. In this event, $$\log x_K = \log x_0 + \gamma L_N \sum_{k=0}^{K-1} a_k.$$

Conversely, the minimum range at time K occurs when the first K input magnitudes are low and $$\log x_K = \log x_0 + \gamma L_1 \sum_{k=0}^{K-1} a_k$$

where Eqs. (2) and (6) imply $L_1 < 0$. Defining, $S_K = \log(\max x_K/\min x_K)$, we obtain $$S_K = \gamma(L_N - L_1) \sum_{k=0}^{K-1} a_k \qquad (7)$$

which shows that $S_K$ goes to infinity as $K \to \infty$ and that for a fixed training time, the quantizer adapts to a set of signal powers which size proportional to $\gamma$.

On the other hand when $x_K$ is near $\sigma\bar{y}$, the range "hunts" for $\sigma\bar{y}$ by taking multiplicative steps proportional to $e^{\gamma}$. This observation suggests that the smaller the value of $\gamma$, the smaller is the expected distance of $x_K$ from $\sigma\bar{y}$, provided $\sigma^2$ is within the set of signal powers to which the quantizer can adapt. A stochastic approximation theorem shows that the exponent sequence, $\{a_k = 1/k\}$, has certain optimal properties and that with this sequence $$\log x_K - \log \sigma\bar{y}$$

is asymptotically (for K large) normal with variance no less than $c\gamma/K$ where $c$ is a constant that depends on the input distribution. If $\epsilon_K$ is defined to be the rms value of $\log(x_K/\sigma\bar{y})$, the theorem suggests that $$\epsilon_K > (c\gamma/K)^{1/2}$$

which, along with Eq. (7), indicates the nature of the compromise between the size of the adaptive interval after K samples and the accuracy of adaptation.

In choosing multipliers $M_i$ and exponents, $a_k$, a designer will be influenced by considerations of economy and circuit precision as well as by the performance parameters $\bar{y}$, $K$, $\epsilon_K$, $S_K$. Suppose that these considerations suggest a quantizer that operates with a limited number of possible ranges.

We refer to an illustrative example to show how multipliers and exponents can be chosen to provide adaptation, within a limited set of ranges, toward a desired final range. To simplify the quantizer, let there be only two distinct multipliers:

$$1 > M_1 = M_2 = \ldots M_{\nu}\ ;\ M_{\nu+1} = M_{\nu+2} = \ldots = M_N > 1.$$

The adaptation rule is $$x_{k+1} = M_1^{a_k} x_k \text{ if } |z_k| \leq x_k \xi_{\nu} \quad = M_N^{a_k} x_k \text{ if } |z_k| > x_k \xi_{\nu} \qquad (8)$$

and the bias function becomes $$\beta(y) = \log M_1 \sum_{i=1}^{\nu} P_i(y) + \log M_N \sum_{i=\nu+1}^{N} P_i(y)$$

$$= \gamma\,[L_1\,Pr\,[|z_k| \leq \sigma y\,\xi_{\nu}\,] + L_N\,Pr\,[|z_k| > \sigma y\,\xi_{\nu}\,]] \qquad (8a)$$

Consider now adaptive quantizers in which $\nu$ can be chosen so that $L_1 = -1$, $L_N = 2$ provides a desirable $y$. In these quantizers $$-Pr\{|z_k| \leq \sigma\bar{y}\xi_{\nu}\} + 2\,Pr\,\{|z_k| > \sigma\bar{y}\xi_{\nu}\} = 0$$

or $$Pr\,\{|z_k| \leq \sigma\bar{y}\xi_{\nu}\} = 2/3, \qquad (9)$$

where we have substituted in Eq. (8a) the numerical values of $L_1$ and $L_N$ and used $\beta(\bar{y}) = 0$. In the simplest such quantizer, with $N = 2$ (4-level quantization), $\mu = \xi_1 = 1$ by definition. If $z_k$ is a Gaussian process, Eq. (9) implies $\bar{y} = 0.97$, quite close to the mean-square optimum value, 0.996, associated with 2-bit uniform quantization.

For this quantizer, a useful sequence of exponents, which meet the above-mentioned requirements for $a_k$ is $$a_k = 1, 1/2, 1/2, 1/4, 1/4, 1/4, 1/4, 1/8, \ldots\ldots 1/8, 1/16 \ldots \qquad (10)$$

If the duration of the training mode is $K = 2^J - 1$ time intervals, where J is a positive integer, we have $$\sum_{k=0}^{K-1} a_k = J = \log_2 (K+1)$$

so that the size of the set of powers to which the quantizer can adapt becomes $$S_K = 3\,\gamma\,\log_2 (K+1)$$

Figure 3:
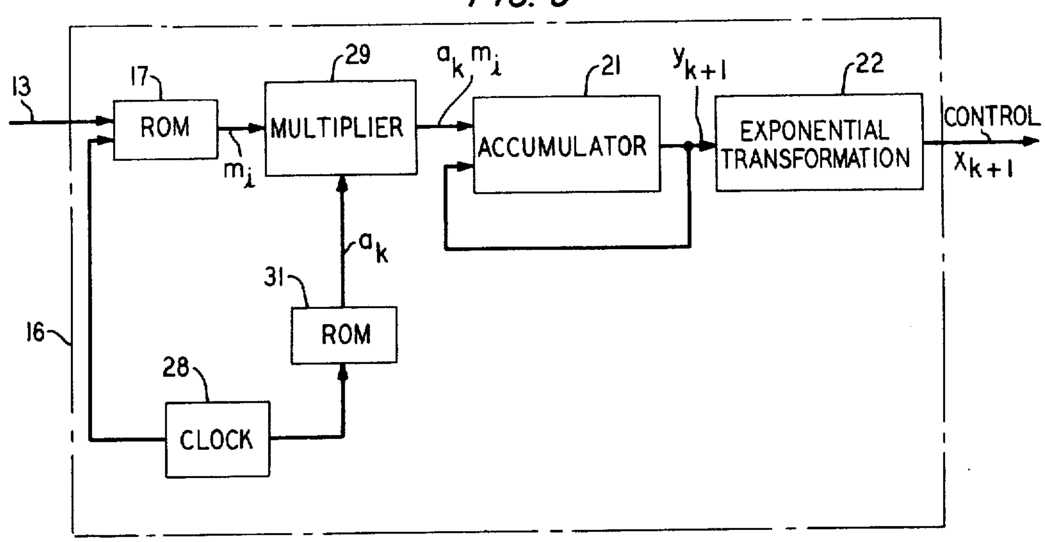
FIG. 3 depicts a first embodiment of an adaption logic control network utilized in the practice of this invention.

FIG. 3 depicts an embodiment of adaptive logic network 16 of FIG. 1 which incorporates the above principles. Referring to Eq. (1), if $y = \log x$, $m = \log M$, then $$y_{k+1} = y_K + a_k m_i \qquad (11)$$

Recalling from Eq. (1), that the range scale $x$ changes by a multiplicative factor determined by the magnitude of the output level associated with $z_k$, read-only memory (ROM) 17, responsive to the output signals of adaptive quantizer 12 of FIG. 1, develops the appropriate multiplicative constant $m_i$. That is, read-only memory 17 generates a plurality of signals representative of the values of $m_i$ in response to the magnitude of the signals appearing on lead 13. Simultaneously, read-only memory 31 sequentially generates a plurality of signals representative of the sequence $a_k$. The duration of the training mode is determined by the length of sequence $a_k$. Both ROMs 17 and 31 are under control of clock 28 which is synchronized with the system clock of FIG. 1 (not shown). Multiplier 29 develops a signal representative of the product of $m_i$ and $a_k$. ROMs 17 and 31 and multiplier 29 may be of any conventional type. The output of multiplier 29 is applied to accumulator 21 which, in cooperation with its feedback loop, develops a signal proportional to $y_{k+1}$. If so desired, an initial value for $y$ may be supplied to accumulator 21. Exponential transformation circuit 22, which may be any conventional antilog multiplier circuit, develops the inverse logarithm of the output signal of accumulator 21 to develop control signal $x_{k+1}$, defined by Eq. (1). This control signal is applied to adaptive quantizer 12 of FIG. 1.

Figure 4:
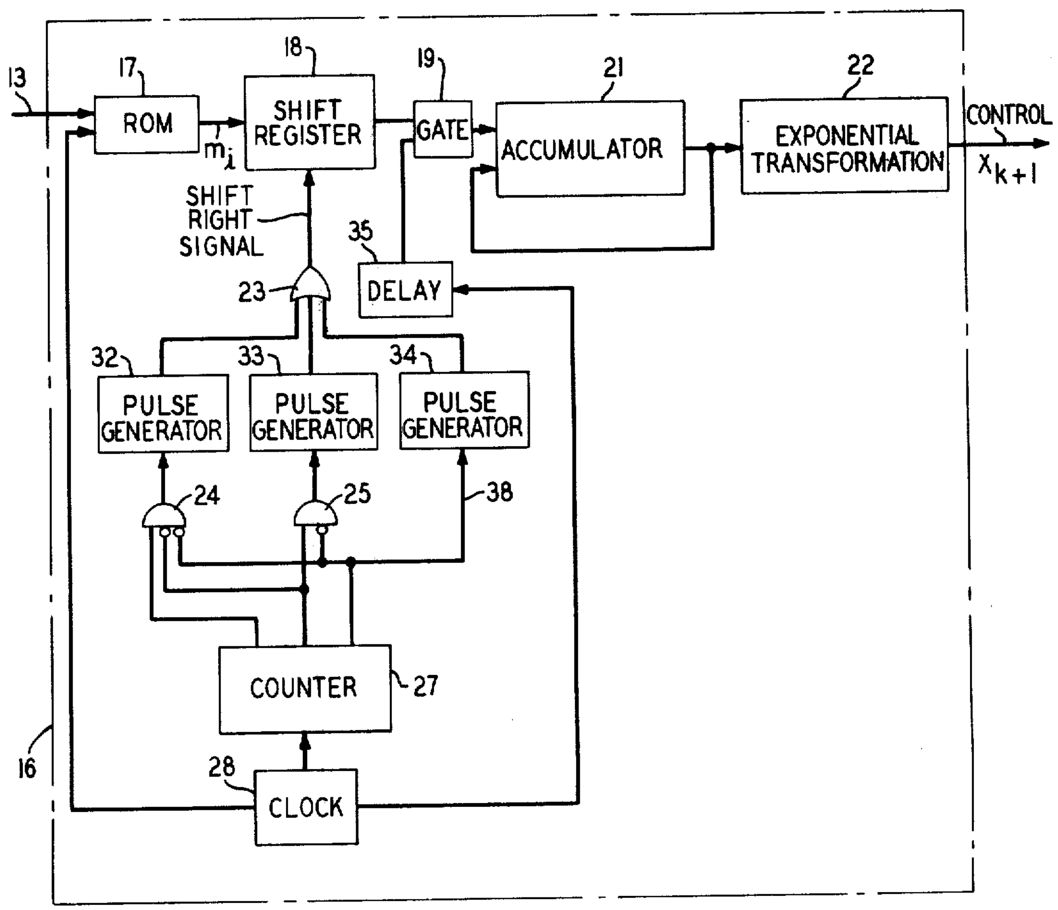
FIG. 4 depicts a second embodiment of an adaption logic control network utilized in the practice of this invention.

If only two distinct multipliers are used to achieve the desired quantizer range, as per Eq. (8), the apparatus of FIG. 3 may be considerably simplified. For example, suitable values for $m_1$ and $m_N$, corresponding to the logarithms of $M_1$ and $M_N$, respectively, are (−1,1) and (−1,2). If the first set, i.e., (−1,1), is selected, read-only memory 17 may be realized by a binary device, responsive to the magnitude of the output signal of quantizer 12, which generates either a +1 signal or a −1 signal. If the values of sequence $a_k$ are selected in accordance with Eq. (10), the multiplication of factor $m_i$ by $a_k$ may be accomplished by a simple shift right operation. FIG. 4 depicts a second embodiment of the adaptive logic network 16 of FIG. 1 which utilizes a shift operation to perform the desired multiplication. Elements identical to those of FIG. 3 have been identically labelled. In FIG. 4, the output of read-only memory 17 is applied to shift register 18 under control of clock 28. Sequence $a_k$ in Eq. (10) implies shifting $m_i$ to the right by zero bits at the first sample time, $k = 1$, by one bit at the second and third sample times, $k = 2,3$, by two bits when $k = 4,5,6,7$, and by three bits when $k = 8, \ldots$, etc. Thus, the number of bits that $m_i$ must be shifted may be determined by the location of the most significant bit in a binary counter. Counter 27 of FIG. 4 performs this function under the control of clock circuit 28. AND circiut 24 detects the presence of a most significant bit in the second stage of counter 27, AND circuit 25 detects the presence of a most significant bit in this third stage of counter 27, and lead 38 is utilized to detect the presence of a most significant bit in the fourth stage of counter 27. Of course, counter 27 may comprise an arbitrary number of stages but, for illustrative purposes, a four-stage counter is depicted which thus determines the training period to be equal to $K = 15$ samples. In practice, a value of K equal to approximately 500 has been found suitable. When a signal representative of $m_1$ is applied to shift register 18 by ROM 17, no shift right signal is applied to register 18, so its contents are directly read out by gate 19 and applied to accumulator 21. Gate 19 is activated by clock 28 via delay network 35. Delay is introduced to allow shift register 18 sufficient time to perform its loading and shifting operations. At the next sample time, a most significant bit appears in the second stage of counter 27, AND circuit 24 is activated, and pulse generator 32 applies a single pulse to OR circuit 23. The output of OR circuit 23 in turn causes the contents, $m_2$, of register 18, supplied by ROM 17, to be shifted to the right by one bit. Likewise, at the third sample time, $m_3$ is shifted by one bit to the right, via activation of register 18 by AND circuit 24, pulse generator 32 and OR circuit 23. At the 4th, 5th, 6th, and 7th sample times, a most significant bit appears in the third stage of counter 27. Accordingly, AND circuit 25 activates pulse generator 33 which in turn, via OR circuit 23, shifts the contents of register 18 by two bits to the right. In order to accomplish this, pulse generator 33, of conventional type, develops two shift pulses whenever activated by AND circuit 25. Similarly, at the 8th, 9th, etc., sample times, pulse generator 34 is activated by the presence of a most significant bit in the last stage of counter 27, and develops three pulses which are utilized via OR circuit 23 to shift the contents of register 18 three bits to the right. Summarizing the operation of the apparatus of FIG. 4, the multipliers, $m_i$, of ROM 17 are sequentially applied to shift register 18. The number stored in shift register 18 is shifted the appropriate amount to the right to perform the required multiplication operation, and the shifted number in register 18 is then applied via gate 19 to accumulator 21. Accumulator 21 and exponential converter circuit 22 perform in the same manner as described for FIG. 3.

It will be apparent to those skilled in the example, that many applications, in addition to that illustrated, exist for the subject invention. Furthermore, many modifications incorporating the principles of this invention are possible. For example, if there is a limited number of possible quantizer ranges and a limited number of distinct multipliers, it is possible to consider each range as a "state" and prepare a table showing the next preferred state for each present state and each desired multiplier. Such a table may be stored in a read-only memory or, alternatively, standard techniques are available for synthesizing logic circuits which would implement such a table. For examlpe, in the above-cited *B.S.T.J.* article realization of an adaption logic circuit is achieved, for 21 possible range states and three distinct multipliers, using logic circuits and current multipliers. The same principles are of course applicable to the adaption logic control circuit of this invention.

What is claimed is:

1. Apparatus for controlling an adaptive quantizer wherein the improvement comprises: means responsive to the output signal of said adaptive quantizer for altering the range scale of said quantizer by a multiplicative factor which is a function of the magnitude of the output signal of said quantizer and a function of time which is independent of the input signal to said quantizer.

2. The improvement defined in claim 1 wherein said multiplicative factor is $M_i^a$ where $M_i$ is dependent upon the magnitude of said adaptive quantizer output signal and $a_k$ is a sequence of time dependent exponents that converges to zero with time.

3. The improvement defined in claim 2 wherein said means for altering said quantizer range scale includes:

first means responsive to said quantizer output signal for sequentially developing a signal proportional to the logarithm of $M_i$;

second means for sequentially developing said time dependent sequence $a_k$;

third means for sequentially multiplying each proportional logarithm signal with a term of said time dependent sequence;

fourth means for accumulating said multiplied signals; and fifth means for developing a signal proportional to the inverse logarithm of said accumulated signals.

4. Apparatus for varying the amplitude range of an adaptive quantizer wherein the improvement comprises:

means responsive to the output signal of said adaptive quantizer for altering the range scale of said quantizer by a multiplicative factor dependent upon the amplitude of the most recently quantized output signal of said quantizer and upon the time elapsed since the first alteration of said range scale, said multiplicative factor converging with time toward a substantially constant value.

5. The improvement defined in claim 4 wherein said multiplicative factor is $M_i^{a_k}$ where $M_i$ is dependent upon the amplitude of the most recently quantized output signal of said adaptive quantizer and $a_k$ is a sequence of time dependent exponents that converges to zero with time.

6. The improvement defined in claim 5 wherein said means for altering said quantizer range scale includes:

first means responsive to said quantizer output signal for developing a signal $m_i = \log M_i$;

second means for sequentially developing signals representative of said time dependent sequence $a_k$;

third means for multiplying each signal $m_i$ with a signal representative of the sequence $a_k$ to develop a signal $a_k m_i$;

fourth means for accumulating said signal $a_k m_i$ to develop a signal $y_{k+1}$, where $y_k = \log x_k$ and $x_k$ is the range scale of said quantizer; and fifth means for developing the inverse logarithm of said signal $y_{k+1}$.

7. Apparatus for controlling an adaptive quantizer responsive to a time dependent input signal $z_k$, wherein the improvement comprises:

means responsive to the output signal $Q(z_k)$ of said adaptive quantizer for altering the range scale $x_k$ of said quantizer in accordance with $x_{k+1} = M_i^{a_k} x_k$ if $Q(z_k) = \pm x_k \eta_i$, where $\eta_i$ is a predetermined constant, $k = 1,2, \ldots, i = 1,2, \ldots N$, the exponents $a_k$ comprise a non-negative sequence independent of $z_k$ which converges to zero so slowly with time that $$\sum_{1}^{\infty} a_k$$

is infinite but rapidly enough so that $$\sum_{1}^{\infty} a_k^2$$

is finite, and the multipliers $M_i$ satisfy the inequalities $1 > M_1 \leq M_2 \leq \ldots \leq M_N > 1$.

8. The improvement defined in claim 7 wherein said means for altering said range scale $x_k$ includes:

first means responsive to said quantizer output signal $Q(z_k)$ for developing a signal $m_i = \log M_i$;

second means for sequentially developing signals representative of said time dependent sequence $a_k$;

third means for multiplying each signal $m_i$ with a sequence signal $a_k$ to develop a signal $a_k m_i$;

fourth means for accumulating said signal $a_k m_i$ to develop a signal $y_{k+1}$, where $y_k = \log x_k$; and fifth means for transforming said signal $y_{k+1}$ to obtain said signal $x_{k+1}$.

9. The improvement defined in claim 8 wherein said sequence $$a_k = 1, ½, ½, ¼, ¼, ¼, ¼, ⅛, \ldots \ldots ⅛, 1/16 \ldots$$

10. The improvement defined in claim 9 wherein said second means further comprises binary counter means responsive to an applied clock signal and means responsive to said counter means for developing control signals representative of the location of the most significant bit in said counter; and said third means comprises shift register means responsive to the output signal of said first means and responsive to said control signals for shifting said first means output signal a predetermined number of bits to the right.

* * * * *